US012718874B2

(12) United States Patent
Lin et al.

(10) Patent No.: US 12,718,874 B2
(45) Date of Patent: Aug. 25, 2026

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Kao-Cheng Lin, Hsinchu (TW); Yen-Huei Chen, Hsinchu (TW); Wei Min Chan, Hsinchu (TW); Hidehiro Fujiwara, Hsinchu (TW); Wei-Cheng Wu, Hsinchu (TW); Pei-Yuan Li, Hsinchu (TW); Chien-Chen Lin, Hsinchu (TW); Shang Lin Wu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 143 days.

(21) Appl. No.: 18/582,160

(22) Filed: Feb. 20, 2024

(65) Prior Publication Data

US 2025/0046367 A1 Feb. 6, 2025

Related U.S. Application Data

(60) Provisional application No. 63/579,850, filed on Aug. 31, 2023, provisional application No. 63/517,159, filed on Aug. 2, 2023.

(51) Int. Cl.
*G11C 11/419* (2006.01)

(52) U.S. Cl.
CPC .................................. *G11C 11/419* (2013.01)

(58) Field of Classification Search
None
See application file for complete search history.

(56) References Cited

U.S. PATENT DOCUMENTS

| | | | | |
|---|---|---|---|---|
| 7,679,948 | B2 | 3/2010 | Park et al. | |
| 8,270,241 | B2 | 9/2012 | Tao | |
| 8,305,827 | B2 | 11/2012 | Tao et al. | |
| 2004/0004856 | A1 | 1/2004 | Sakimura et al. | |
| 2009/0116279 | A1* | 5/2009 | Maeda | G11C 11/412 365/226 |
| 2009/0207650 | A1* | 8/2009 | Braceras | G11C 11/417 365/156 |

(Continued)

FOREIGN PATENT DOCUMENTS

| | | | |
|---|---|---|---|
| TW | 201528277 | A | 7/2015 |
| TW | I578321 | B | 4/2017 |

*Primary Examiner* — Kretelia Graham
(74) *Attorney, Agent, or Firm* — Foley & Lardner LLP

(57) ABSTRACT

A memory circuit includes an array including a plurality of memory cells arranged across a plurality of columns and a plurality of voltage control circuits, each of the plurality of voltage control circuits operatively coupled to the memory cells of a corresponding one of the plurality of columns. Each of the plurality of voltage control circuits includes a first portion configured to provide a first voltage drop in coupling a supply voltage to the memory cells of the corresponding column and a second portion configured to provide a second voltage drop in coupling the supply voltage to the memory cells of the corresponding column. The first voltage drop is substantially smaller than the second voltage drop.

20 Claims, 10 Drawing Sheets

(56) References Cited

U.S. PATENT DOCUMENTS

2012/0287736 A1* 11/2012 Cheng .................. G11C 11/419
365/194
2022/0084583 A1* 3/2022 Sugahara .............. H03K 3/356

* cited by examiner

SEMICONDUCTOR DEVICES AND METHODS OF MANUFACTURING THEREOF

CROSS-REFERENCE TO RELATED APPLICATION

This application claims priority to and the benefit of U.S. Provisional Application No. 63/579,850, filed Aug. 31, 2023, and also claims priority to and the benefit of U.S. Provisional Application No. 63/517,159, filed Aug. 2, 2023, each of which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
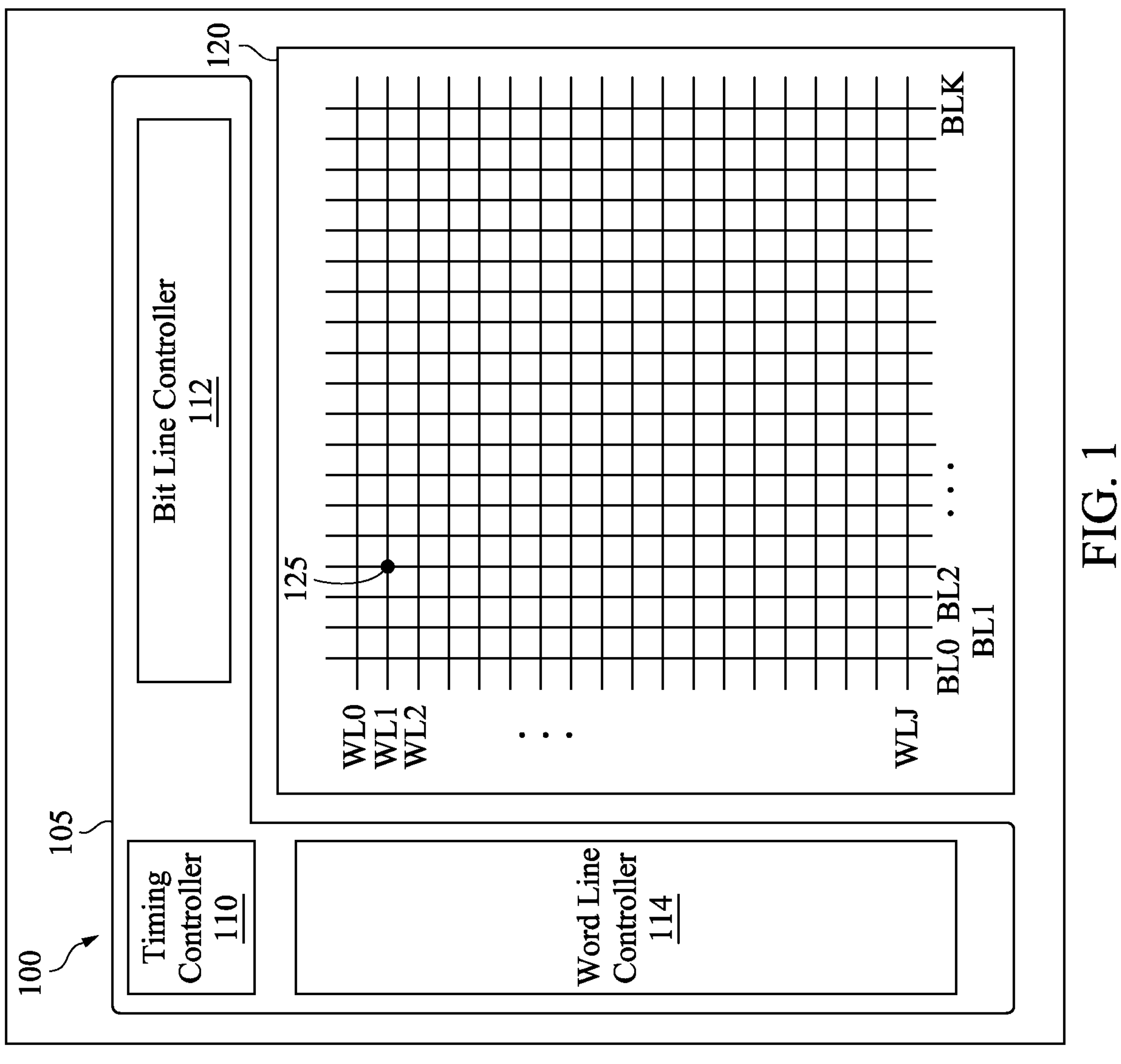
FIG. 1 illustrates a block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” “top,” “bottom” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A traditional memory device can suffer from write ability issues (e.g., weak write issues due to fighting of a P-type transistor and an N-type transistor). The write ability could be improved using, for example, negative bit lines, which however, consume large area and energy. As disclosed herein, by implementing a voltage control circuit (e.g., SPVD) to supply a voltage drop, the write margin and noise margin of the memory device can be improved, thereby allowing for improved stability and reliability of the memory device operations.

Techniques disclosed herein are related to a voltage control circuit for a memory device. The memory device can include an array including memory cells arranged across columns, and the voltage control circuit can be coupled to one or more of the memory cells of a corresponding one of the columns. In various embodiments, the voltage control circuit may supply the coupled memory cells with an intentional voltage drop based on a self-power voltage drop (SPVD) scheme. With the intentional voltage drop, a write margin of the coupled memory cells can be advantageously increased. The voltage control circuit can include a first portion (e.g., a weak header) configured to provide a first voltage drop in coupling a supply voltage to the corresponding memory cells, and a second portion (e.g., a strong header) configured to provide a second voltage drop in coupling the supply voltage to the corresponding memory cells. In various embodiments, the first voltage drop can be substantially larger than the second voltage drop. In various embodiments, the second portion (e.g., the strong header) can be selectively deactivated (e.g., when the memory cells are selected to be written), which causes the selected memory cells to receive (or otherwise operate) under a relatively low supply voltage. As disclosed herein, this improves the write ability of the memory device. The voltage drop (e.g., CVDD IR drop) can be selectively provided when a write contention current occurs at a weak writability cell, such that a larger IR drop occurs at the P-type transistor of the cell to suppress the strength the P-type transistor, thereby helping the write margin. For example, the voltage drop can be provided when a severe write contention happens at the worst writability cell. Further, while sharing a retention header, a weak header of the voltage control circuit can hold a static noise margin (SNM) for those un-selected cells without requiring an overhead area. This provides area/energy efficient solutions over a conventional memory device. In some embodiments, the techniques disclosed herein can improve an area efficiency up to <1% due to simple logic and timing control, in comparison to a negative bit line scheme (e.g., >3%).

FIG. 1 illustrates a block diagram of an example memory device 100, in accordance with some embodiments. The memory device 100 includes a memory controller 105 and a memory array 120. The memory array 120 may include a plurality of storage circuits or memory cells 125 arranged in two- or three-dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes word lines WL0, WL1 . . . . WLJ, each extending in a first direction (e.g., X-direction) and bit lines BL0, BL1 . . . . BLK, each extending in a second direction (e.g., Y-direction). The word lines WL and the bit lines BL may be conductive metals or conductive rails. In one configuration, each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a non-volatile memory, or a combination of them. In some embodiments, each memory cell 125 is embodied as a static random access memory (SRAM) cell or other type of memory cell. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, and a timing controller 110. The bit line controller 112, the word line controller 114, and the timing controller 110 may be embodied as logic circuits, analog circuits, or a combination thereof. In one configuration, the word line controller 114 is a circuit that provides a voltage or current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. In some embodiments, the timing controller 110 is embodied as or includes a processor and a non-transitory computer readable medium storing instructions when executed by the processor cause the processor to execute one or more functions of the timing controller 110 or the memory controller 105 described herein. The bit line controller 112 may be coupled to bit lines BL of the memory array 120, and the word line controller 114 may be coupled to word lines WL of the memory array 120. In some embodiments, the memory controller 105 includes more, fewer, or different components than shown in FIG. 1.

In some embodiments, the timing controller 110 may generate control signals to coordinate operations of the bit line controller 112 and the word line controller 114. In some embodiments, to write data at a memory cell 125, the timing controller 110 may cause the word line controller 114 to apply a voltage or current to the memory cell 125 through a word line WL coupled to the memory cell 125 and cause the bit line controller 112 to apply a voltage or current corresponding to data to be stored to the memory cell 125 through a bit line BL coupled to the memory cell 125. In some embodiments, to read data from a memory cell 125, the timing controller 110 may cause the word line controller 114 to apply a voltage or current to the memory cell 125 through a word line WL coupled to the memory cell 125 and cause the bit line controller 112 to sense a voltage or current corresponding to data stored by the memory cell 125 through a bit line BL coupled to the memory cell 125.

Figure 2:
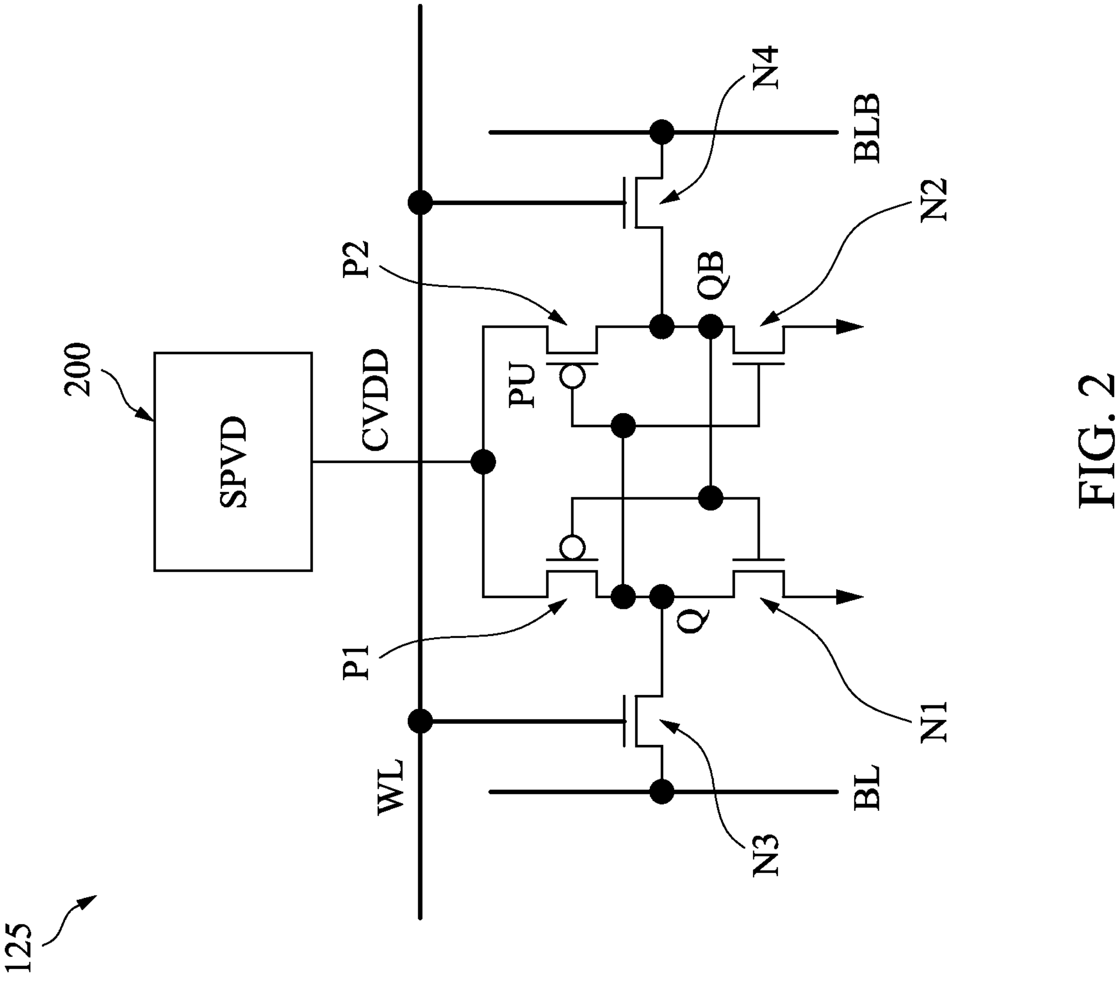
FIG. 2 illustrates a schematic diagram of an example memory cell, in accordance with some embodiments.

FIG. 2 illustrates a schematic diagram of an example memory cell 125, in accordance with some embodiments. In some embodiments, the memory cell 125 includes N-type transistors N1, N2, N3, N4 and P-type transistors P1, P2. The N-type transistors N1, N2, N3, N4 may be N-type metal-oxide-semiconductor field-effect transistors (MOSFET) or N-type fin field-effect transistors (FinFET). The P-type transistors P1, P2 may be P-type MOSFET or P-type FinFET. These components may operate together to store a bit. In some embodiments, the memory cell 125 includes more, fewer, or different components than shown in FIG. 2.

In some embodiments, the N-type transistors N3, N4 include gate electrodes coupled to a word line WL. In some embodiments, a drain electrode of the N-type transistor N3 is coupled to a bit line BL, and a source electrode of the N-type transistor N3 is coupled to a port Q. In some embodiments, a drain electrode of the N-type transistor N4 is coupled to a bit line BLB, and a source electrode of the N-type transistor N4 is coupled to a port QB. In some aspects, the N-type transistors N3, N4 operate as electrical switches. The N-type transistors N3, N4 may allow the bit line BL to electrically couple to or decouple from the port Q and allow the bit line BLB to electrically couple to or decouple from the port QB, according to a voltage applied to the word line WL. For example, according to a supply voltage VDD (e.g., 1V) corresponding to a high state (e.g., logic value '1') applied to the word line WL, the N-type transistor N3 is enabled to electrically couple the bit line BL to the port Q and the N-type transistor N4 is enabled to electrically couple the bit line BLB to the port QB. For another example, according to a ground voltage VSS (e.g., 0V) corresponding to a low state (e.g., logic value '0') applied to the word line WL, the N-type transistor N3 is disabled to electrically decouple the bit line BL from the port Q and the N-type transistor N4 is disabled to electrically decouple the bit line BLB from the port QB.

In some embodiments, the N-type transistor N1 includes a source electrode coupled to a first supply voltage rail supplying the ground voltage VSS or 0V, a gate electrode coupled to the port QB, and a drain electrode coupled to the port Q. In some embodiments, the P-type transistor P1 includes a source electrode coupled to a second supply voltage rail supplying the supply voltage CVDD, a gate electrode coupled to the port QB, and a drain electrode coupled to the port Q. In some embodiments, the N-type transistor N2 includes a source electrode coupled to the first supply voltage rail supplying the ground voltage VSS or 0V, a gate electrode coupled to the port Q, and a drain electrode coupled to the port QB. In some embodiments, the P-type transistor P2 includes a source electrode coupled to the second supply voltage rail supplying the supply voltage CVDD, a gate electrode coupled to the port Q, and a drain electrode coupled to the port QB.

In some embodiments, the N-type transistor N1 and the P-type transistor P1 operate as an inverter, and the N-type transistor N2 and the P-type transistor P2 operate as an inverter, such that two inverters form cross-coupled inverters. In one aspect, the cross-coupled inverters may sense and amplify a difference in voltages at the ports Q, QB. When writing data, the cross-coupled inverters may sense voltages at the ports Q, QB provided through the N-type transistors N3, N4 and amplify a difference in voltages at the bit lines BL, BLB. For example, the cross-coupled inverters sense a voltage 0.5 V at the port Q and a voltage 0.4V at the port QB, and amplify a difference in the voltages at the ports Q, QB through a positive feedback (or a regenerative feedback) such that the voltage at the port Q becomes the supply voltage VDD (e.g., 1V) and the voltage at the port QB becomes the ground voltage VSS (e.g., 0V). The amplified voltages at the ports Q, QB may be provided to the bit lines BL, BLB through the N-type transistors N3, N4, respectively for reading.

As shown, the source electrode of the P-type transistor P1 and the source electrode of the P-type transistor P2 can be coupled to a voltage control circuit 200 (e.g., SPVD) to receive the supply voltage CVDD. The voltage control circuit 200 can provide the supply voltage CVDD (e.g., with a voltage drop) to the P-type transistors P1 and/or P2. In some embodiments, the voltage control circuit 200 can supply the supply voltage CVDD with a voltage drop to the P-type transistors P1 and/or P2, when a write contention current occurs, thereby suppressing the strength the corresponding P-type transistor and improving the write margin.

Figure 3:
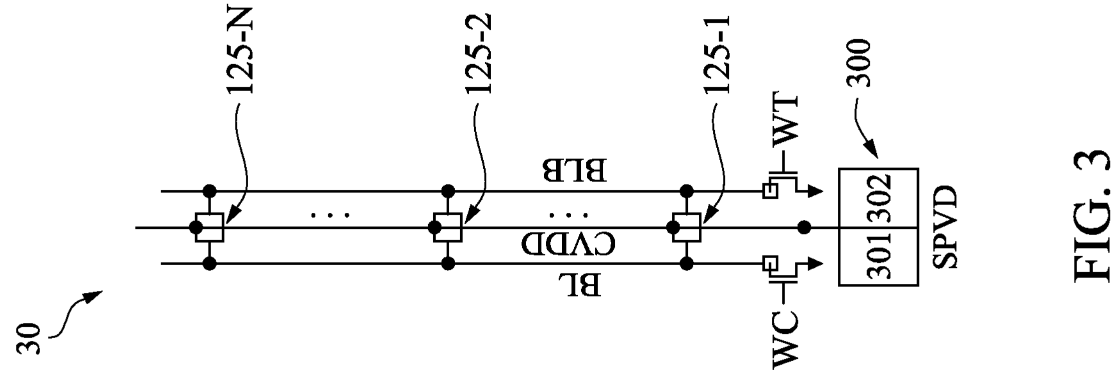
FIGS. 3, 4, 5, 6A, 6B, 6C, 6D, 7A, and 8A illustrate a partial view of an example memory device, in accordance with some embodiments.

FIG. 3 illustrates a partial view 30 of an example memory device, in accordance with some embodiments. More specifically, the partial view 30 may be a column of a plurality of columns of the memory array 120, in which a voltage control circuit 300 is operatively coupled to a plurality of memory cells (e.g., 125-1, 125-2, . . . 125-N) of the column. The plurality of memory cells 125-1, 125-2, . . . 125-N may be substantially similar to or incorporate features of the memory cell 125 in FIG. 2. The voltage control circuit 300 may be substantially similar to or incorporate features of the voltage control circuit 200, 300. Although a single column of the memory array 120 is depicted, the memory device can include a plurality of voltage control circuits 300, each of which is operatively coupled to the memory cells of a corresponding one of the plurality of columns of the memory array 120. The voltage control circuit 300 can provide a supply voltage CVDD (e.g., with a voltage drop) to the memory cells (e.g., 125-1, 125-2, . . . 125-N).

The voltage control circuit 300 includes a first portion 301 configured to provide a first voltage drop in coupling the supply voltage CVDD to the memory cells (e.g., 125-1, 125-2, . . . 125-N). The voltage control circuit 300 includes a second portion 302 configured to provide a second voltage drop in coupling the supply voltage CVDD to the memory cells (e.g., 125-1, 125-2, . . . 125-N). In some embodiments, the first voltage drop is substantially smaller than the second voltage drop. In some embodiments, the first portion 301 is associated with (e.g., coupled to) a first resistance, and the second portion 302 is associated with (e.g., coupled to) a second resistance. That is, the first resistance can be substantially smaller than the second resistance, such that a voltage drop (e.g., IR drop) associated with the CVDD of the first portion 301 is substantially smaller than that of the second portion 302.

In some embodiments, the first portion 301 can be configured to selectively couple the supply voltage CVDD to each of the memory cells (e.g., 125-1, 125-2, . . . 125-N) while the second portion can be configured to couple the supply voltage CVDD to each of the first memory cells (e.g., 125-1, 125-2, . . . 125-N). For example, the first portion 301 can be configured to selectively couple the supply voltage CVDD to each of the memory cells (e.g., 125-1, 125-2, . . . 125-N) while the second portion can be configured to always couple the supply voltage CVDD to each of the first memory cells (e.g., 125-1, 125-2, . . . 125-N). In some embodiments, the second portion 302 can be activated, while the first portion 301 can be selectively deactivated in response to the corresponding column being selected. For example, the second portion 302 can be always activated, while the first portion 301 can be selectively deactivated in response to the corresponding column being selected. For examples, each first portion 301 of a first set of voltage control circuits 300 coupled to a first set of columns of the memory array 120 can be deactivated, while each first portion 301 of a second set of voltage control circuits 300 coupled to a second set of columns of the memory array 120 can be activated.

In some embodiments, the first portion 301 may include a P-type transistor gated based on a logic combination of a first control signal and a second control signal. In some embodiments, the first control signal may be a write data signal WC and the second control signal may be a precharge signal WT. In some embodiments, the first control signal may be a write enable signal YW (not shown) and a bit write enable signal BWE (not shown).

Figure 4:
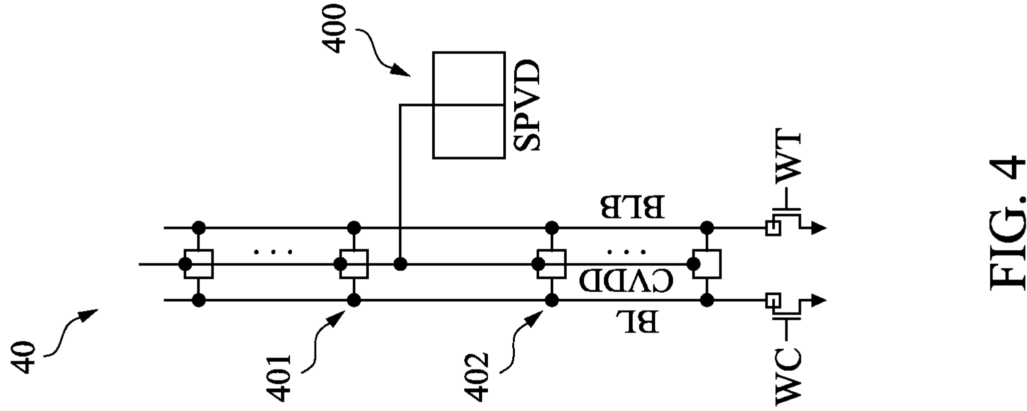

FIG. 4 illustrates a partial view 40 of an example memory device, in accordance with some embodiments. More specifically, the partial view 40 may be a column of a plurality of columns of the memory array 120, in which a voltage control circuit 400 is operatively coupled to a plurality of memory cells of the column. The voltage control circuit 400 may be substantially similar to or incorporate features of the voltage control circuit 200, 300. Although a single column of the memory array 120 is depicted, the memory device can include a plurality of voltage control circuits 400, each of which is operatively coupled to the memory cells of a corresponding one of the plurality of columns of the memory array 120. Alternatively or additionally (e.g., as opposed to the voltage control circuit 300 of FIG. 3), the voltage control circuit 400 can be disposed between a first row 401 and a second row 402 of the corresponding column.

Figure 5:
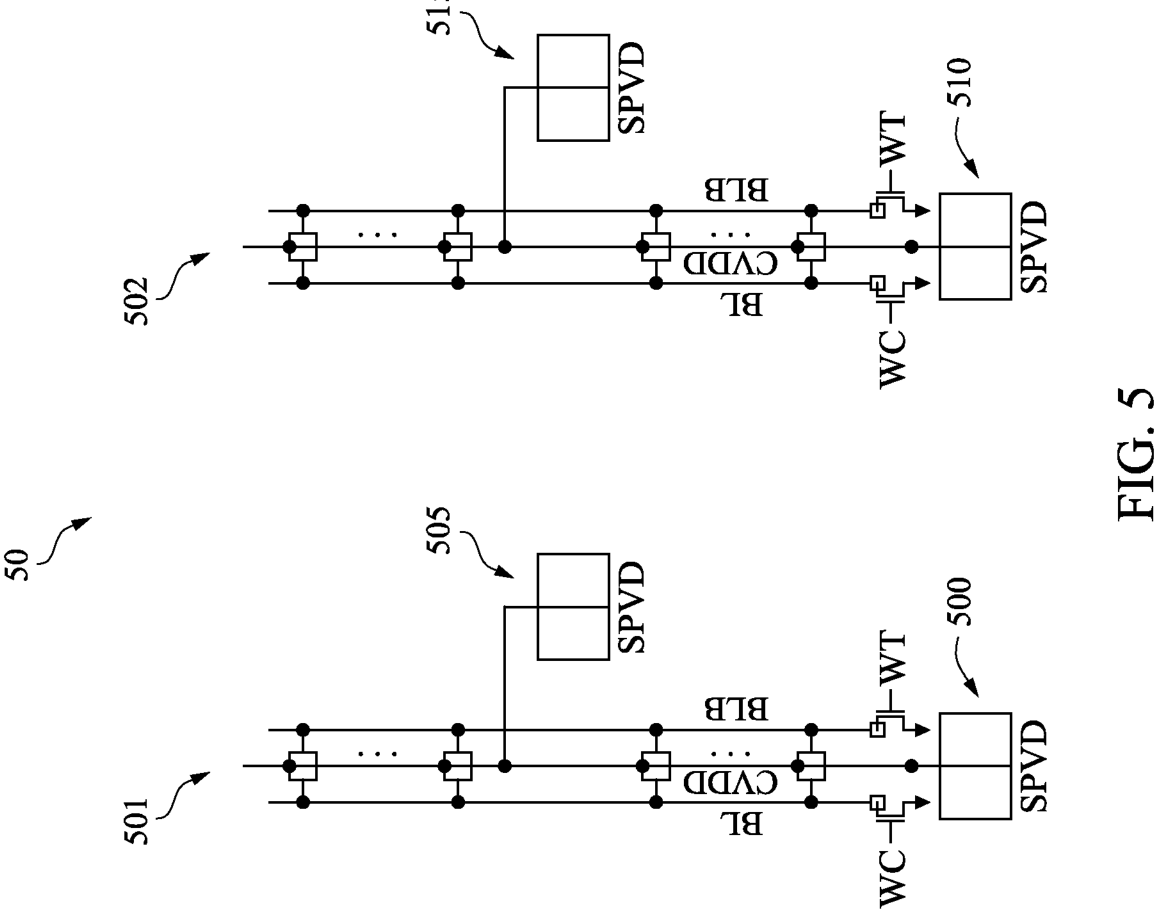

It should be noted that the voltage control circuits can be arranged in various ways, and that shown in the disclosure is merely a non-limiting example. For example, as shown in FIG. 5, a memory array can include both the voltage control circuit 300 (coupled at a bottom portion of the column) and the voltage control circuit 400 (coupled between a first row and a second row) in a same column. For example, the arrangement of voltage control circuits in a first column may be different from the arrangement of voltage control circuits in a second column.

FIG. 5 illustrates a partial view 50 of an example memory device, in accordance with some embodiments. More specifically, the partial view 50 may be a first column 501 and a second column 502 of a plurality of columns of the memory array 120, in which voltage control circuits 500, 505, 510, 515 are operatively coupled to a plurality of memory cells of the respective column. The voltage control circuits 500, 505, 510, 515 may be substantially similar to or incorporate features of the voltage control circuit 200, 300. As shown, the voltage control circuits 500, 505 can be operably coupled to the first column 501, and the voltage control circuits 510, 515 can be operably coupled to the second column 502. Likewise, one or more of a plurality of voltage control circuits can be operatively coupled to the memory cells of a corresponding one of the plurality of columns.

FIGS. 6A, 6B, 6C, and 6D illustrate partial views 61, 63, 65, and 67 of example memory devices, respectively, in accordance with some embodiments. More specifically, each of the partial views 61, 63, 65, 67 may be a column of a plurality of columns of the memory array 120, in which each of voltage control circuits 610, 630, 650, 670 is operatively coupled to a plurality of memory cells of the corresponding column, respectively. The voltage control circuits 610, 630, 650, 670 may be substantially similar to or incorporate features of the voltage control circuit 200, 300. As shown, the voltage control circuit 610 includes a first portion 611 and a second portion 612; the voltage control circuit 630 includes a first portion 631 and a second portion 632; the voltage control circuit 650 includes a first portion 651 and a second portion 652; the voltage control circuit 670 includes a first portion 671 and a second portion 672. The first portions 611, 631, 651, 671 may be substantially similar to or incorporate features of the first portion 301. The second portions 612, 632, 652, 672 may be substantially similar to or incorporate features of the second portion 302.

Figures 6A, 6B, 6C, 6D:
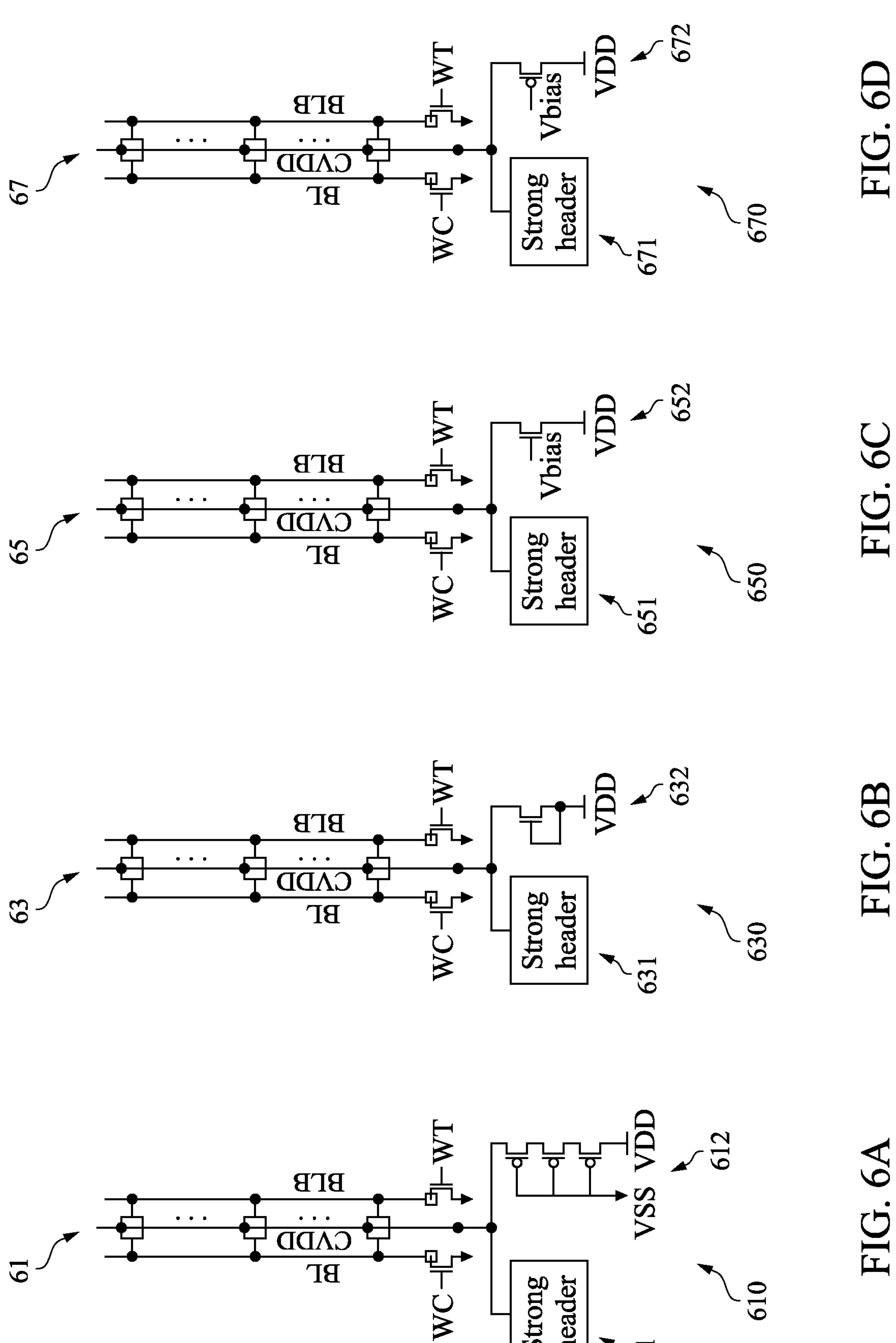

Referring to FIG. 6A, the second portion 612 can include a plurality of P-type transistors serially coupled to each other. For example, the second portion 612 can include a plurality of P-type transistors stacked to one another. Each gate electrode of the stacked P-type transistors can be connected to a ground voltage VSS, while a source/drain end of the serially coupled P-type transistors is connected to a power supply voltage VDD. Although the second portion 612 shows three P-type transistors, the second portion 612 can include any number of P-type transistors.

Referring to FIG. 6B, the second portion 632 can include a diode-connected transistor. For example, the second portion 632 can include a diode-connected N-type transistor. For example, the second portion 632 can include a diode-connected P-type transistor. A source/drain end of the diode-connected transistor is connected to a power supply voltage VDD.

Referring to FIG. 6C, the second portion 652 can include an N-type transistor gated by a fixed voltage. A source/drain end of the transistor gated by a fixed voltage is connected to a power supply voltage VDD.

Referring to FIG. 6D, the second portion 672 can include a P-type transistor gated by a fixed voltage. A source/drain end of the transistor gated by a fixed voltage is connected to a power supply voltage VDD.

In some embodiments, although not depicted, a second portion (e.g., 302) of a voltage control circuit (e.g., 200) can include any combination of a P-type transistor, an N-type transistor, a diode, etc. and/or any connection with VSS/VDD. A non-limiting example may be the second portion including at least one of: a P-type transistor gated by a fixed voltage or connected to a plurality of P-type transistors, or an N-type transistor gated by a fixed voltage or connected to a diode.

Figure 7B:
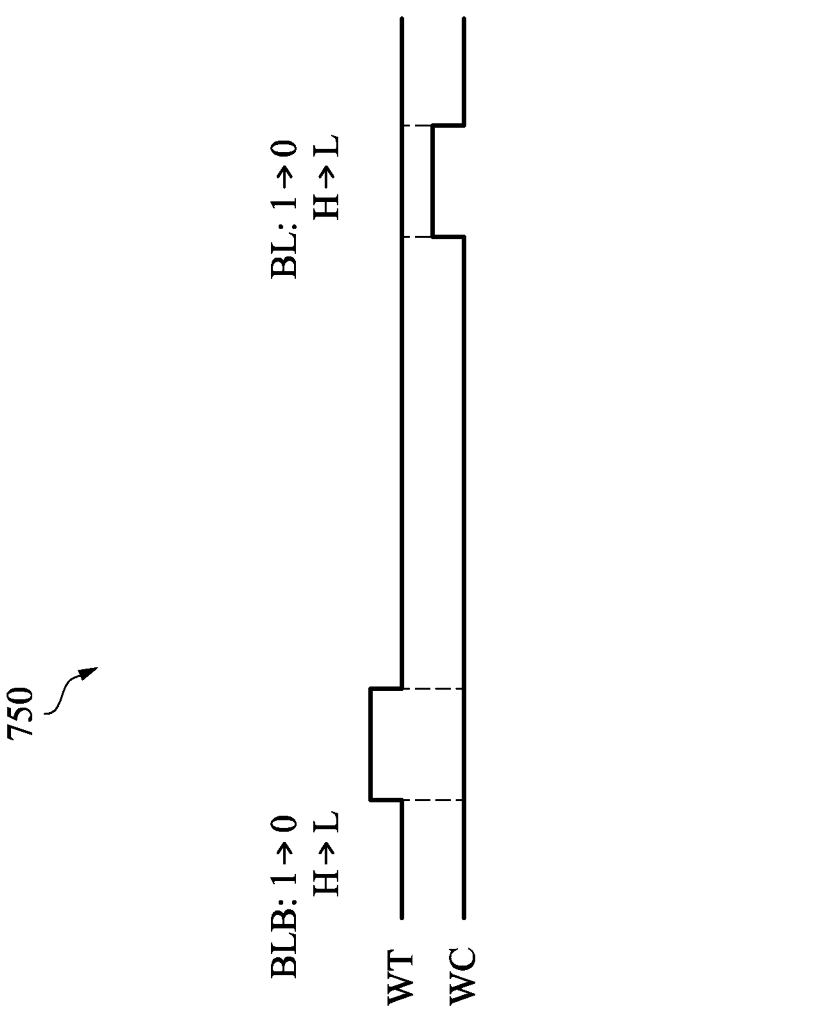
FIGS. 7B and 8B illustrate an example waveform associated with an example memory device, in accordance with some embodiments.
Figure 7A:
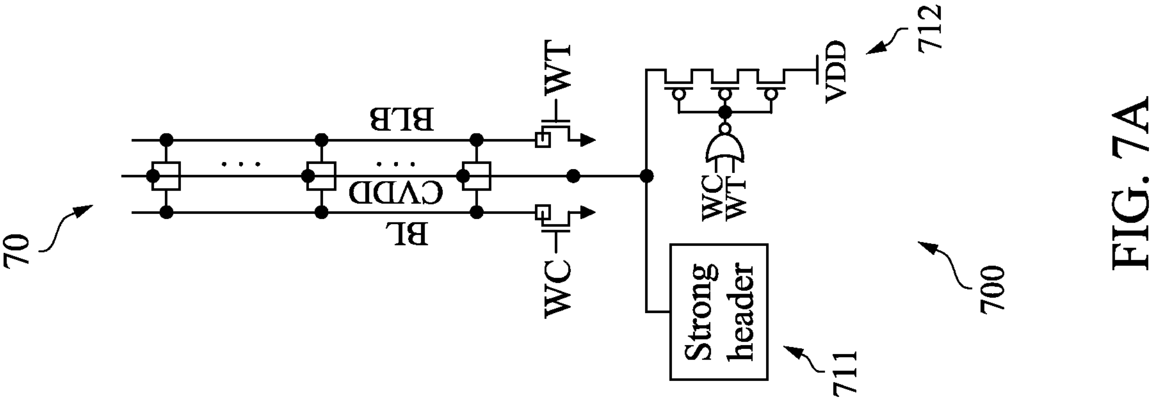

FIG. 7A illustrates a partial view 70 of an example memory device, in accordance with some embodiments. More specifically, the partial view 70 may be a column of a plurality of columns of the memory array 120, in which a voltage control circuit 700 is operatively coupled to a plurality of memory cells of the column. The voltage control circuit 700 may be substantially similar to or incorporate features of the voltage control circuit 200, 300, 610, etc. The voltage control circuit 700 can include a first portion 711 and a second portion 712 that includes at least one transistor. In some embodiments, the second portion 712 is gated by a write data signal WC and a precharge signal WT while connected to a power supply voltage VDD.

FIG. 7B illustrates an example waveform 750 associated with an example memory device, in accordance with some embodiments. More specifically, the waveform 750 is associated with a first state of the memory cells shown in the partial view 70. When at least one of the memory cells in the partial view 70 is selected to be written (e.g., when the corresponding row is activated), one of the first control signal (e.g., WT) or the second control signal (e.g., WC) is asserted to a logic high and the other of the first control signal or the second control signal is asserted to a logic low, thereby deactivating the first portion 711. For example, as shown in FIG. 7B, the precharge signal WT is asserted to a logic low (e.g., 0), which asserts the bit line BLB, and the write data signal WC is asserted to a logic high (e.g., 1), which asserts the bit line BL, thereby deactivating the first portion 711. That is, for the selected memory cell to operate in a write operation, the first portion 711 can be deactivated by the first control signal and the second control signal. The deactivation of the first portion 711 can decouple a supply voltage from the memory cells in the corresponding column.

Although not depicted, when the memory cell is in a second state (e.g., selected to be read), both the first control signal (e.g., WT) and the second control signal (e.g., WC) are asserted to a logic high, thereby activating the first portion 811. For example, both the precharge signal WT and the write data signal WC are asserted to a logic high (e.g., 1), which assert the bit lines BL, BLB, thereby activating the first portion 711. That is, for the selected memory cell to operate in a read operation, the first portion 711 can be selectively activated by the first control signal and the second control signal. The activation of the first portion 711 can couple a supply voltage to each of the memory cells in the corresponding column.

Figure 8B:
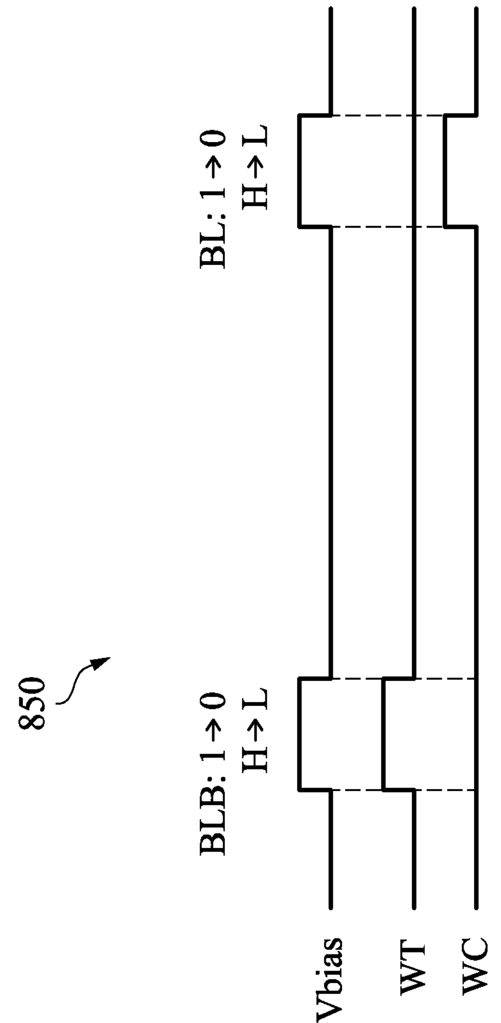
Figure 8A:
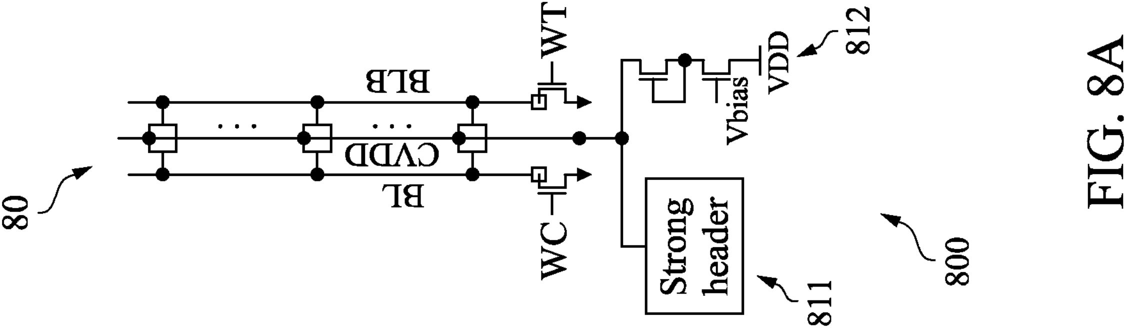

FIG. 8A illustrates a partial view 80 of an example memory device, in accordance with some embodiments. More specifically, the partial view 80 may be a column of a plurality of columns of the memory array 120, in which a voltage control circuit 800 is operatively coupled to a plurality of memory cells of the column. The voltage control circuit 800 may be substantially similar to or incorporate features of the voltage control circuit 200, 300, 610, 630, 650, etc. The voltage control circuit 800 can include a first portion 811 and a second portion 812 that includes at least one transistor. In some embodiments, the second portion 812 includes a first transistor connected to a diode and a second transistor gated by a fixed voltage.

FIG. 8B illustrates an example waveform 850 associated with an example memory device, in accordance with some embodiments. More specifically, the waveform 850 is associated with a first state of the memory cells shown in the partial view 70. When at least one of the memory cells in the partial view 80 is selected to be written (e.g., when the corresponding row is activated), one of the first control signal (e.g., WT) or the second control signal (e.g., WC) is asserted to a logic high and the other of the first control signal or the second control signal is asserted to a logic low, thereby deactivating the first portion 811. For example, as shown in FIG. 8B, the precharge signal WT is asserted to a logic low (e.g., 0), which asserts the bit line BLB, and the write data signal WC is asserted to a logic high (e.g., 1), which asserts the bit line BL, thereby deactivating the first portion 811. That is, for the selected memory cell to operate in a write operation, the first portion 811 can be deactivated by the first control signal and the second control signal. The deactivation of the first portion 811 can decouple a supply voltage from the memory cells in the corresponding column.

In some embodiments, the precharge signal WT and the write data signal WC can be asserted according to the bias signal Vbias, such that the precharge signal WT or the write data signal WC is asserted to a logic high when the bias signal Vbias is asserted to a logic high.

Although not depicted, when the memory cell is in a second state (e.g., selected to be read), both the first control signal (e.g., WT) and the second control signal (e.g., WC) are asserted to a logic high, thereby activating the first portion 811. For example, both the precharge signal WT and the write data signal WC are asserted to a logic high (e.g., 1), which assert the bit lines BL, BLB, thereby activating the first portion 811. That is, for the selected memory cell to operate in a read operation, the first portion 811 can be selectively activated by the first control signal and the second control signal. The activation of the first portion 811 can couple a supply voltage to each of the memory cells in the corresponding column.

Figures 9A, 9B:
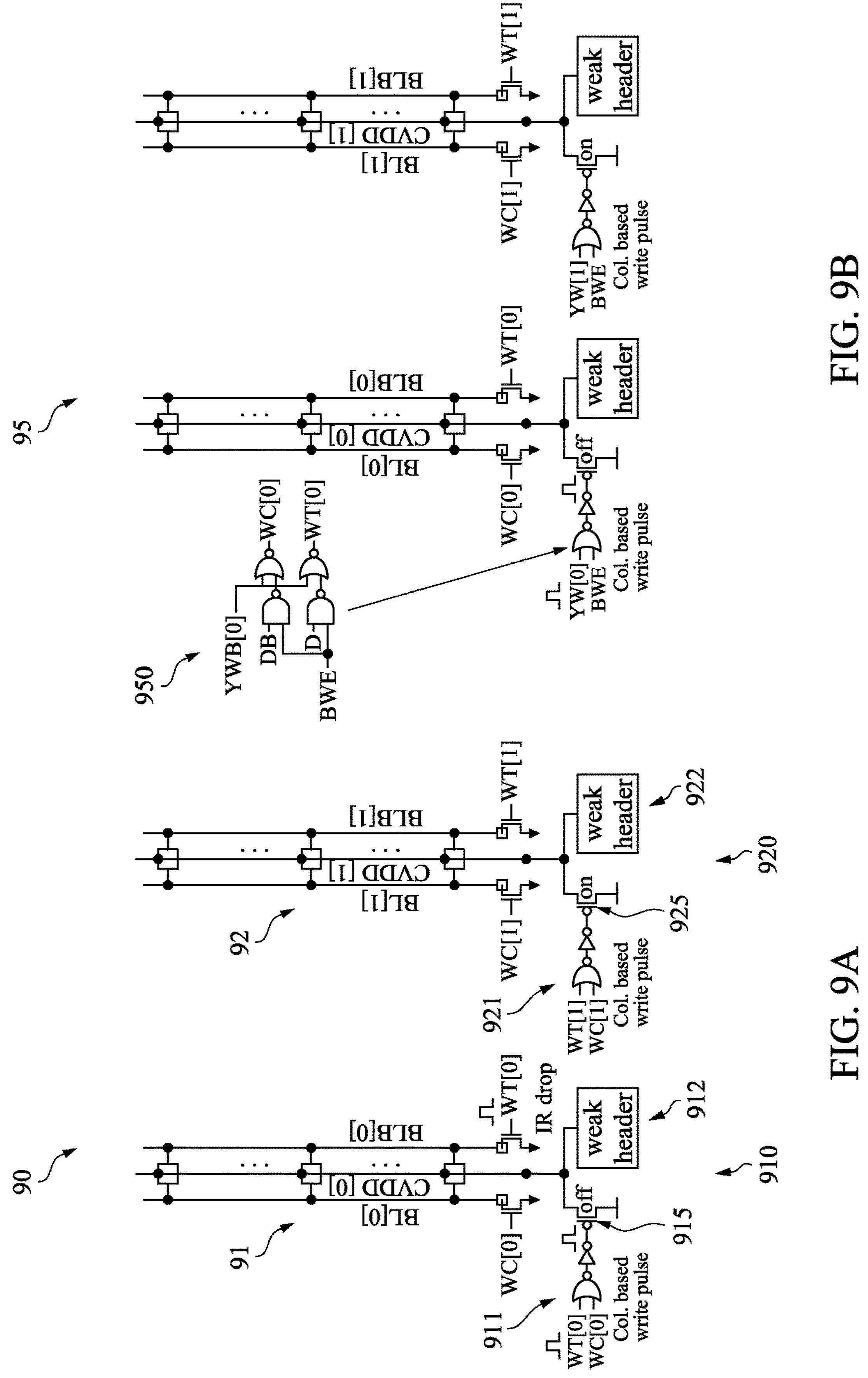
FIGS. 9A and 9B illustrate a partial view of an example memory device, in accordance with some embodiments.

FIG. 9A illustrates a partial view 90 of an example memory device, in accordance with some embodiments. More specifically, the partial view 90 may be columns of the memory array 120. A first column 91 includes a voltage control circuit 910 that includes a first portion 911 and a second portion 912. The voltage control circuit 910 is coupled to memory cells of the first column 91 and provides a supply voltage CVDD [0]. A second column 92 includes a voltage control circuit 920 that includes a first portion 921 and a second portion 922. The voltage control circuit 920 is coupled to memory cells of the second column 92 and provides a supply voltage CVDD [1]. The voltage control circuits 910, 920 may be substantially similar to or incorporate features of the voltage control circuit 200, 300.

In some embodiments, the first portions 911, 921 may include a P-type transistor gated based on a logic combination of a first control signal WT and a second control signal WC. As shown in FIG. 9A, the first portion 911 of the first column 91 includes a P-type transistor 915 gated based on a logic combination of a first control signal WT[0] and a second control signal WC[0]; and the first portion 921 of the second column 92 includes a P-type transistor 925 gated based on a logic combination of a first control signal WT[1] and a second control signal WC[1].

The first and second columns 91, 92 of the memory device can be controlled by a column-based pulse (e.g., the first control signal WT, second control signal WC). As shown in FIG. 9A, the first portion 911 of the first column 91 can receive the first control signal WT[0] with a logic high and the second control signal WC[0] with a logic low, thereby deactivating (e.g., turning off) the P-type transistor 915, while the second portion 912 of the first column 91 provides the supply voltage CVDD[0] with a voltage drop (IR drop). In the second column 92, the first portion 921 can receive the first control signal WT[1] with a logic high and the second control signal WC[1] with a logic high, thereby activating (e.g., turning on) the P-type transistor 925. The first portion 921 and the second portion 922 of the second column 92 provide the supply voltage CVDD[1].

Although not depicted, in some embodiments, both of the first portion 911 and the first portion 921 can be deactivated/activated based on the control signals (e.g., WT[0], WC[0], WT[1], WC[1], etc.).

FIG. 9B illustrates a partial view 95 of an example memory device, in accordance with some embodiments. The partial view 95 may be the partial view 90, in which a logic circuit 950 is additionally coupled to the first portions 911, 921. The logic circuit 950 can receive a third signal and a fourth signal. In some embodiments, the third signal may be a write enable signal YW (or YWB). In some embodiments, the fourth signal may be a logic combination of a bit write enable signal BWE and a data input signal D (or a data input bar signal DB). In some embodiments, the memory device can include or operatively couple with a data input (DIN) to receive the data input signal D and/or the data input bar signal DB. Based on a logic combination of the third signal and the fourth signal, each of the first portions 911, 921 can receive corresponding first and second control signals WC and WT.

Figure 10:
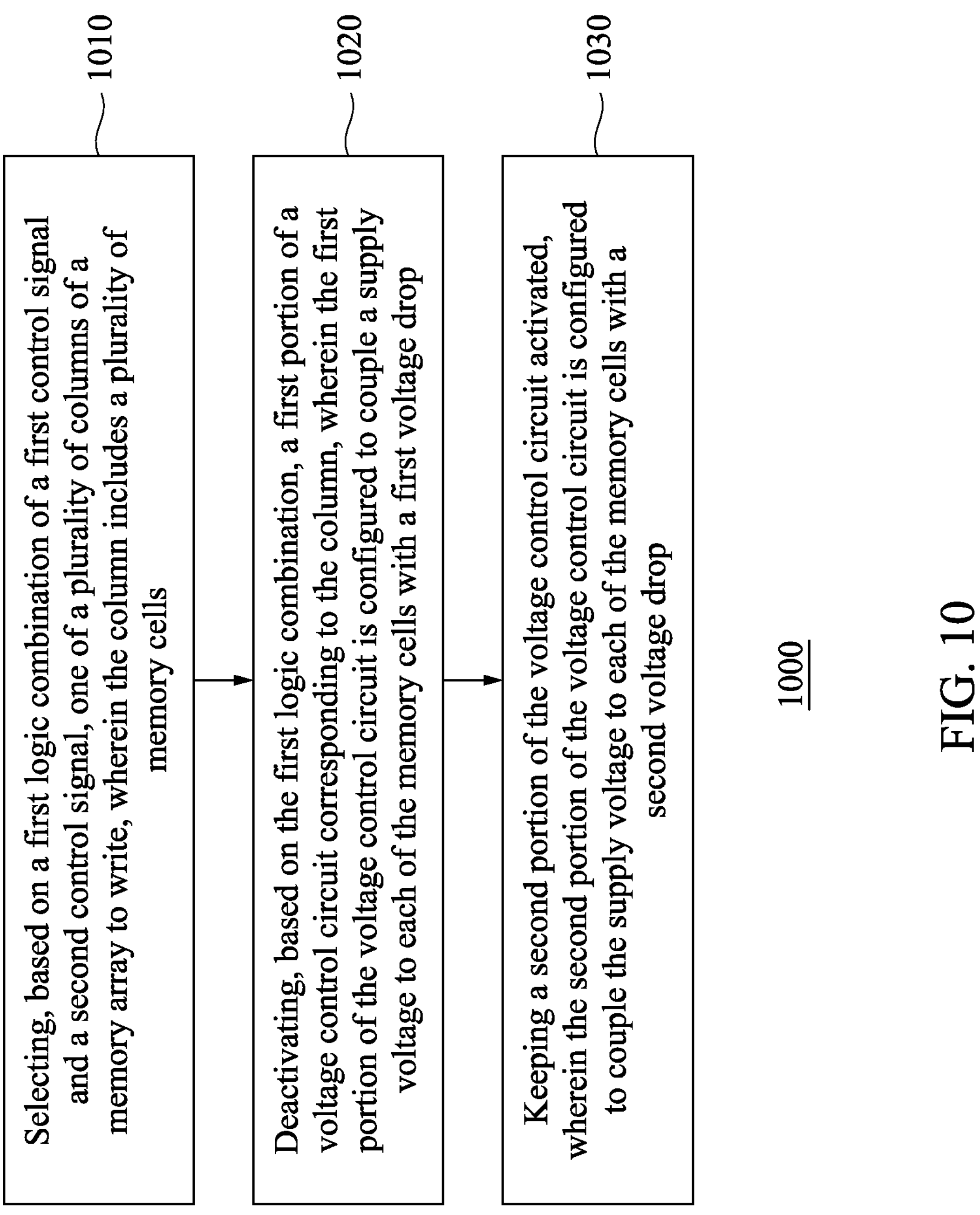
FIG. 10 is a flow chart of an example method for operating an example memory device, in accordance with some embodiments.

FIG. 10 is a flow chart of an example method 1000 for operating an example memory device (e.g., memory device 100), in accordance with some embodiments. In some embodiments, the method 1000 is performed by a controller (e.g., memory controller 105). In some embodiments, the method 1000 is performed by other entities. In some embodiments, the method 1000 is performed to write data at a selected memory cell. In some examples, the method 1000 includes more, fewer, or different steps than shown in FIG. 10. In some examples, the method 1000 can be performed in a different order than shown in FIG. 10.

In a brief over view, the method 1000 can start with operation 1010 of selecting, based on a first logic combination of a first control signal and a second control signal, one of a plurality of columns of a memory array to write, wherein the column includes a plurality of memory cells. The method 1000 can continue to operation 1020 of deactivating, based on the first logic combination, a first portion of a voltage control circuit corresponding to the column, wherein the first portion of the voltage control circuit is configured to provide a first voltage drop in coupling a supply voltage to each of the memory cells. The method 1000 can continue to operation 1030 of keeping a second portion of the voltage control circuit activated, wherein the second portion of the voltage control circuit is configured to provide a second voltage drop in coupling the supply voltage to each of the memory cells.

At operation 1010, a controller (e.g., memory controller 105) can select, based on a first logic combination of a first control signal (e.g., first control signal WT) and a second control signal (e.g., first control signal WC), one of a plurality of columns of a memory array (e.g., memory array 120) to write, wherein the column includes a plurality of memory cells (e.g., memory cell 125). In some examples, the controller can control a memory cell to be read when one of the first control signal or the second control signal is asserted to a logic high and the other of the first control signal or the second control signal is asserted to a logic low. In some examples, the controller can control a memory cell to be written when both of the first control signal and the second control signal are asserted to a logic high, thereby activating the first portion.

At operation 1020, the controller can deactivate, based on the first logic combination, a first portion (e.g., first portion 301) of a voltage control circuit (e.g., voltage control circuit 200) corresponding to the column, wherein the first portion of the voltage control circuit is configured to provide a first voltage drop in coupling a supply voltage (e.g., CVDD) to each of the memory cells.

At operation 1030, the controller can maintain a second portion (e.g., second portion 302) of the voltage control circuit activated, wherein the second portion of the voltage control circuit is configured to provide a second voltage drop in coupling the supply voltage to each of the memory cells.

In some embodiments, at any of operations 1010, 1020, 1030, the controller can deselect, based on a second logic combination of the first control signal and the second control signal, the columns to write, and activate, based on the second logic combination, the first portion of the voltage control circuit, while keeping the second portion of the voltage control circuit activated.

In some embodiments, at any of operations 1010, 1020, 1030, the column can further include a first bit line and a second bit line that are coupled to ground through a first write driver and a second write driver, and the first write driver and the second write driver are activated/deactivated by the first control signal and the second control signal, respectively.

In one aspect of the present disclosure, a memory circuit is disclosed. The memory circuit includes an array including a plurality of memory cells arranged across a plurality of columns; and a plurality of voltage control circuits, each of the plurality of voltage control circuits operatively coupled to the memory cells of a corresponding one of the plurality of columns; wherein each of the plurality of voltage control circuits includes: a first portion configured to provide a first voltage drop in coupling a supply voltage to the memory cells of the corresponding column; and a second portion configured to provide a second voltage drop in coupling the supply voltage to the memory cells of the corresponding column; wherein the first voltage drop is substantially smaller than the second voltage drop.

In another aspect of the present disclosure, a memory circuit is disclosed. The memory circuit includes a plurality of first memory cells arranged along a first column; and a first voltage control circuit coupled to each of the first memory cells and including a first portion and a second portion, wherein the first portion is configured to selectively couple a supply voltage to each of the first memory cells while the second portion is configured to couple the supply voltage to each of the first memory cells. The first portion is associated with a first resistance and the second portion is associated with a second resistance. The first resistance is substantially smaller than the second resistance.

In yet another aspect of the present disclosure, a method for operating a memory circuit is disclosed. The method includes selecting, based on a first logic combination of a first control signal and a second control signal, one of a plurality of columns of a memory array to write, wherein the column includes a plurality of memory cells; deactivating, based on the first logic combination, a first portion of a voltage control circuit corresponding to the column, wherein the first portion of the voltage control circuit is configured to provide a first voltage drop in coupling a supply voltage to each of the memory cells; and keeping a second portion of the voltage control circuit activated, wherein the second portion of the voltage control circuit is configured to provide a second voltage drop in coupling couple the supply voltage to each of the memory cells. The first voltage drop is substantially smaller than the second voltage drop.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., +10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:

an array comprising a plurality of memory cells arranged across a plurality of columns; and a plurality of voltage control circuits, each of the plurality of voltage control circuits operatively coupled to the memory cells of a corresponding one of the plurality of columns;

wherein each of the plurality of voltage control circuits comprises:

a first portion configured to provide a first voltage drop in coupling a supply voltage to the memory cells of the corresponding column; and a second portion configured to remain always activated to provide a second voltage drop in coupling the supply voltage to the memory cells of the corresponding column;

wherein the first voltage drop is substantially smaller than the second voltage drop.

2. The memory circuit of claim 1, wherein the first portion is selectively deactivated in response to the corresponding column being selected.

3. The memory circuit of claim 2, wherein the first portion include a p-type transistor gated based on a logic combination of a first control signal and a second control signal.

4. The memory circuit of claim 3, wherein the second portion includes a plurality of p-type transistors serially coupled to each other.

5. The memory circuit of claim 3, wherein the second portion includes a diode-connected n-type transistor.

6. The memory circuit of claim 3, wherein the second portion includes a p-type transistor gated by a fixed voltage.

7. The memory circuit of claim 3, wherein the second portion includes an n-type transistor gated by a fixed voltage.

8. The memory circuit of claim 3, wherein, when at least one of the memory cells of the corresponding column are selected to be written, one of the first control signal or the second control signal is asserted to a logic high and the other of the first control signal or the second control signal is asserted to a logic low, thereby deactivating the first portion.

9. The memory circuit of claim 3, wherein, when at least one of the memory cells of the corresponding column are selected to be read, both of the first control signal and the second control signal are asserted to a logic high, thereby activating the first portion.

10. The memory circuit of claim 1, wherein the plurality of memory cells each include a Static Random Access Memory (SRAM) cell.

11. A memory circuit, comprising:

a plurality of first memory cells arranged along a first column; and a first voltage control circuit coupled to each of the first memory cells and comprising a first portion and a second portion, wherein the first portion is configured to selectively couple a first supply voltage drop in providing a supply voltage to each of the first memory cells while the second portion is configured to remain always activated to couple a second supply voltage drop in providing the supply voltage to each of the first memory cells;

wherein the first portion is associated with a first resistance and the second portion is associated with a second resistance, and wherein the first resistance is substantially smaller than the second resistance.

12. The memory circuit of claim 11, further comprising:

a plurality of second memory cells arranged along a second column; and a second voltage control circuit coupled to each of the second memory cells and comprising a third portion and a fourth portion, wherein the third portion is configured to selectively couple the first supply voltage drop to each of the second memory cells while the fourth portion is configured to couple the second supply voltage drop to each of the second memory cells;

wherein the third portion is associated with the first resistance and the fourth portion is associated with the second resistance.

13. The memory circuit of claim 11, wherein the first voltage control circuit is disposed between a first row of the first column and a second row of the first column.

14. The memory circuit of claim 11, further comprising a second voltage control circuit coupled to each of the plurality of first memory cells.

15. The memory circuit of claim 11, wherein the second portion includes at least one of:

a p-type transistor gated by a fixed voltage or connected to a plurality of p-type transistors; or an n-type transistor gated by a fixed voltage or connected to a diode.

16. The memory circuit of claim 11, wherein when at least one of the plurality of first memory cells is being read, the first portion is activated to couple the first supply voltage drop to each of the first memory cells.

17. The memory circuit of claim 11, wherein when at least one of the plurality of first memory cells is being written, the first portion is deactivated to decouple the first supply voltage drop from each of the first memory cells.

18. A method for operating a memory circuit, comprising:

selecting, based on a first logic combination of a first control signal and a second control signal, one of a plurality of columns of a memory array to write, wherein the column includes a plurality of memory cells;

selectively deactivating, based on the first logic combination, a first portion of a voltage control circuit corresponding to the column, wherein the first portion of the voltage control circuit is configured to provide a first voltage drop in coupling a supply voltage to each of the memory cells; and keeping a second portion of the voltage control circuit always activated to provide a second voltage drop in coupling the supply voltage to each of the memory cells;

wherein the first voltage drop is substantially smaller than the second voltage drop.

19. The method of claim 18, further comprising:

deselecting, based on a second logic combination of the first control signal and the second control signal, the columns to write; and activating, based on the second logic combination, the first portion of the voltage control circuit, while keeping the second portion of the voltage control circuit activated.

20. The method of claim 18, wherein the column further includes a first bit line and a second bit line that are coupled to ground through a first write driver and a second write driver, and wherein the first write driver and the second write driver are activated/deactivated by the first control signal and the second control signal, respectively.

* * * * *